United States Patent [19]

Dike et al.

[11] Patent Number: 4,835,422
[45] Date of Patent: May 30, 1989

[54] ARBITER CIRCUITS WITH METASTABLE FREE OUTPUT

[75] Inventors: Charles E. Dike, Pleasant Grove; Edward A. Burton, Provo, both of Utah

[73] Assignee: North American Philips Corporation, Sunnyvale, Calif.

[21] Appl. No.: 167,599

[22] Filed: Mar. 14, 1988

[51] Int. Cl.$^4$ .................. H03K 17/16; H03K 17/30
[52] U.S. Cl. .................... 307/518; 307/443; 307/454; 307/362; 328/133; 340/825.5
[58] Field of Search ............ 307/443, 445, 454, 464, 307/470–471, 475, 514, 518, 528, 362, 480, 272 A; 328/110, 133; 340/825.5, 825.51

[56] References Cited

U.S. PATENT DOCUMENTS

| 3,311,881 | 3/1967 | Mellott | 340/825.51 |
| 4,034,303 | 7/1977 | Kodaira | 307/480 X |
| 4,225,795 | 9/1980 | Keeney | 328/133 X |
| 4,398,101 | 8/1983 | Friauf | 307/445 |
| 4,403,192 | 9/1983 | Williman | 307/357 X |
| 4,423,384 | 12/1983 | DeBock | 340/825.51 X |
| 4,475,049 | 10/1984 | Smith et al. | 307/443 X |
| 4,502,014 | 2/1985 | Bismarck | 328/133 X |
| 4,620,118 | 10/1986 | Barber | 307/518 |
| 4,663,620 | 5/1987 | Paul et al. | 340/825.5 |

OTHER PUBLICATIONS

"Differential Latched Receiver Circuit", IBM T.D.B., vol. 29, No. 3, Aug. 1986, p. 1414.

Primary Examiner—David Hudspeth
Attorney, Agent, or Firm—R. Meetin; D. Treacy; T. Briody

[57] ABSTRACT

A high-speed low-power-consumption two-input arbiter circuit comprises two input inverters, two inverters cross-coupled to form a latch and two additional inverters that drive a difference detector. The detector responds only to a voltage difference on its inputs that exceeds a specified value. In this way, signals are blocked from appearing at the outputs of the detector while the latch is in a metastable state. Additionally, an n-input arbiter circuit comprises $(n-1)+(n-2)+\ldots+[n-(n-1)]$ two-input arbiter circuits and logic circuitry connected to the outputs of the two-input circuits for supplying a priority signal to one and only one at a time of n output terminals of the n-input circuit.

12 Claims, 5 Drawing Sheets

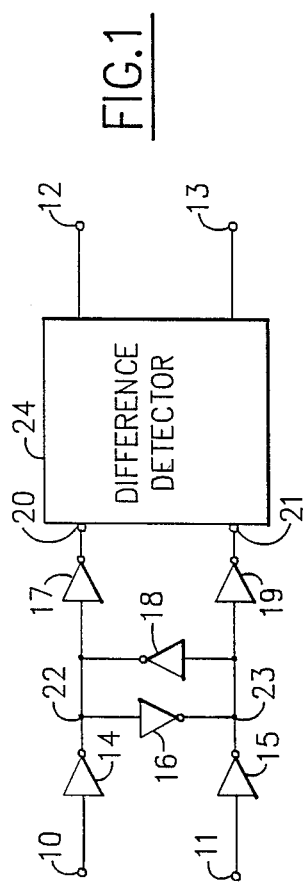
FIG.1
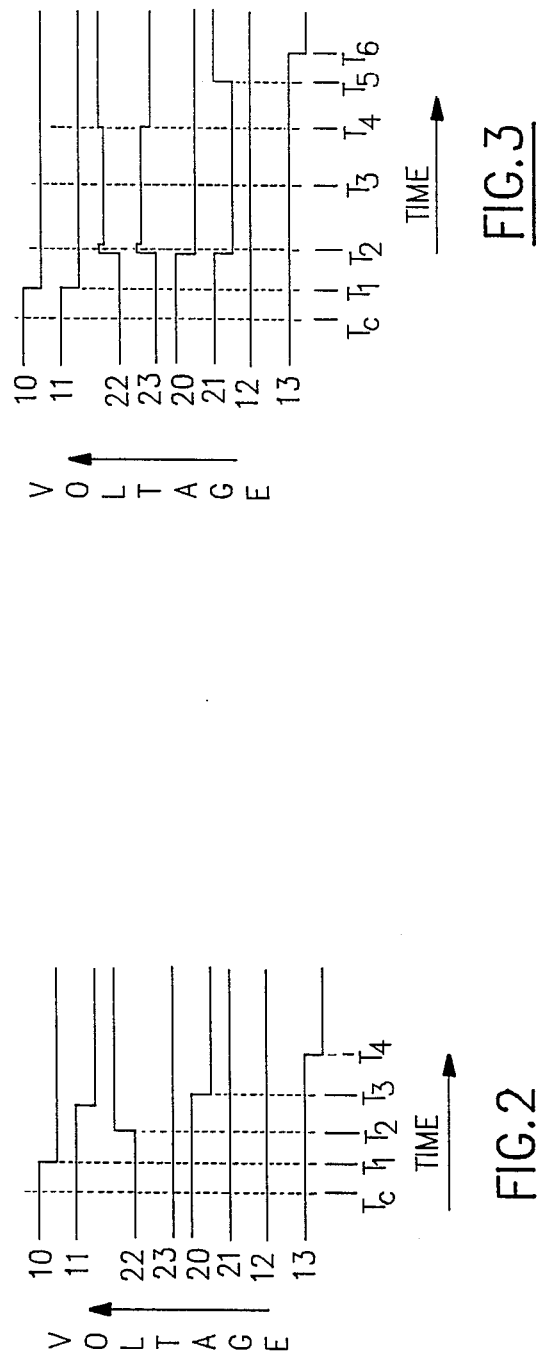
FIG.2
FIG.3

ARBITER CIRCUITS WITH METASTABLE FREE OUTPUT

BACKGROUND OF THE INVENTION

This invention relates to digital logic circuitry and, more particularly, to arbiter circuits.

Two-input arbiter circuits are well known in the field of digital logic circuitry. An arbiter circuit responds to the respective application of asynchronous signals to its inputs to provide an output representation that is uniquely indicative of which of the input signals arrived first in time. If the input signals arrive at the same time, the circuit makes an arbitrary decision as to which input signal it will consider to have arrived first.

Conventional arbiter circuits commonly include a latch comprising cross-coupled gates. One of the problems frequently encountered in a circuit of this type is that the output of the latch may go through a metastable state which differs from the prescribed output digital states that the arbiter circuit is designed to provide. Also, the metastable states, if they occur, may be preceded by the generation of so-called rut pulses. If they appear at the output of the arbiter circuit, these pulses may provide false signals to associated circuitry.

U.S. Pat. No. 4,398,105 issued to P. J. Keller described an improved two-input arbiter circuit of the type that includes a latch comprising cross-coupled gates. A feature of the Keller circuit is that it blocks any metastable states of the latch (and any accompanying rut pulses) from appearing at the output of the arbiter circuit.

As designs in the field of digital logic circuitry have trended toward higher speed and lower power consumption, workers in the field have attempted to simplify the design of arbiter circuits such as those of the Keller type. It was recognized that these efforts, if successful, could provide an improved arbiter circuit more compatible with the requirements of modern-day high-speed low-power-consumption digital systems.

SUMMARY OF THE INVENTION

In accordance with the principles of the present invention, a two-input arbiter circuit comprises two input inverter gates connected to two cross-coupled inverter gates that form a latch. In turn, the outputs of the latch are respectively connected to two inputs of a difference detector via two additional inverter gates. The difference detector responds only to input voltages whose difference exceeds a specified value. In that way, the difference detector is effective to block any metastable states and rut pulses from appearing at the outputs of the arbiter circuit.

In one specific embodiment of the invention, a twoinput arbiter circuit includes only ten bipolar transistors and four diodes. In this embodiment, the transistors are of the open-collector type and are Schottky-diode clamped. Importantly, the output levels of this particular circuit are compatible with the standard digital circuit technology commonly known as transistor-transistor logic (TTL).

In accordance with another aspect of this invention, an n-input arbiter circuit includes a number of two-input arbiter circuits. Illustratively, each such two-input arbiter circuit is a modified version of the two-input circuit mentioned above. The modification involves connecting two inverter gates to the respective outputs of the aforementioned difference detector.

In accordance with the invention, an n-input arbiter circuit includes $(n-1)+(n-2)+\ldots+[n-(n-1)]$ two-input arbiter circuits. Each of the two-input arbiter circuits is connected to arbitrate between one of the $(n-1)+(n-2)+\ldots+[n-(n-1)]$ different possible pairs of input combinations. The two-input circuits respond to one or more request signals applied to the n input terminals of the circuit at a given instant of time to make a decision in each two-input circuit of which of the request signals applied thereto is to be given priority on the outputs of each individual circuit. Further, logic circuitry is connected to the outputs of the two-input circuits for supplying a priority signal to one and only one of n output terminals of the n-input circuit.

BRIEF DESCRIPTION OF THE DRAWING

A complete understanding of the present invention and of the above and other features and advantages thereof may be gained from a consideration of the following detailed description presented hereinbelow in connection with the accompanying drawing, in which:

FIG. 1 is a symbolic representation of a two-input arbiter circuit made in accordance with the principles of the present invention;

FIGS. 2 and 3 show voltage waveforms at various points in the FIG. 1 circuit;

DETAILED DESCRIPTION

Figure 4:
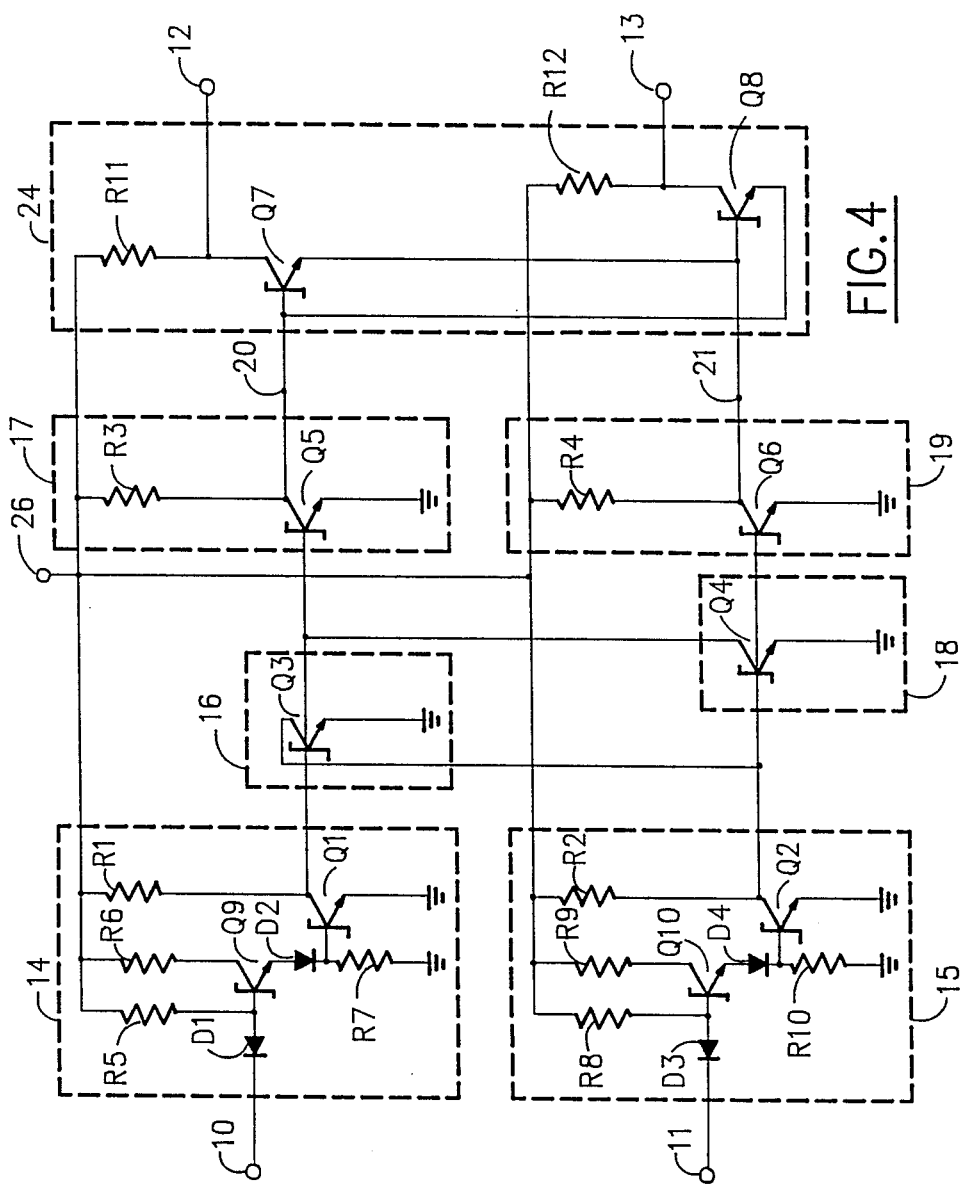
FIG. 4 is a specific illustrative schematic depiction of one particular embodiment of the FIG. 1 circuit.

The two-input arbiter circuit shown in FIG. 1 includes input terminals 10 and 11 and output terminals 12 and 13. The input terminal 10 is connected to the input of a first inverter gate 14, and the input terminal 11 is connected to the input of a second inverter gate 15.

The output of the first inverter gate 14 of FIG. 1 is connected to the respective inputs of third and fourth inverter gates 16 and 17 and to the output of a fifth inverter gate 18. Similarly, the output of the second inverter gate 15 is connected to the respective inputs of the fifth inverter gate 18 and a sixth inverter gate 19. The output of the second gate 15 is also connected to the output of the third gate 16. As depicted, the inverter gates 16 and 18 are cross-coupled to form a latch.

Further, as indicated in FIG. 1, the output of the fourth inverter gate 17 is connected to a first input terminal 20 of a difference detector 24. The output of the sixth inverter gate 19 is connected to a second input terminal 21 of the difference detector 24.

The design of the difference detector 24 shown in FIG. 1 is such that the voltage appearing at each of its output terminals 12 and 13 is always relatively HIGH unless the difference in the voltages respectively applied to its input terminals 20 and 21 differs by more than a specified value. More specifically, the functional operation of the detector 24 is similar to that of a conventional EXCLUSIVE-NOR gate. Each output of the detector 24 will be HIGH if both inputs are HIGH or if both inputs are LOW. However, for either output to be LOW, the two inputs must differ by more than a prescribed value (which will be specified below in connection with the description of FIG. 4). In order for the output terminal 12 of the detector 24 to be LOW, the voltage of the input terminal 20 must be more than the prescribed value greater than the voltage of the input terminal 21. Similarly, in order for the voltage of the output terminal 13 to be LOW, the Voltage of the input terminal 21 must be more than the prescribed value greater than the voltage of the input terminal 20. At no time can the voltages appearing at the output terminals 12 and 13 of the detector 24 be LOW at the same time.

The operation of the FIG. 1 arbiter circuit can be understood with the aid of the waveforms shown in FIGS. 2 and 3. Each of FIGS. 2 and 3 depicts voltage as a function of time for each of various specified terminals and node points of FIG. 1.

Initially, at time $T_0$ of FIG. 2, both of the input terminals 10 and 11 of FIG. 1 are assumed to be HIGH. As shown, this causes node points 22 and 23 to each be LOW. In this condition, the gates 16 and 18 are disabled. The gates 17 and 19 cause the input terminals 20 and 21 of the detector 24 to both be HIGH. Consequently, the outputs at the terminals 12 and 13 are also HIGH, as indicated at $T_0$ in FIG. 2.

Assume now that the input terminal 10 of FIG. 1 goes LOW while the input terminal 11 remains HIGH, as represented in FIG. 2 at time $T_1$. Subsequently (at time $T_2$ in FIG. 2), the node point 22 goes HIGH which causes the node point 23 to remain LOW. With the node point 22 HIGH, the voltage at the input terminal 20 of the detector 24 will go LOW, as indicated at $T_3$ in FIG. 2. Since the input terminal 21 remained HIGH, this allows the output terminal 13 of the detector 24 to go LOW, at $T_4$ in FIG. 2.

If the input terminal 11 of the FIG. 1 circuit goes LOW while the input terminal 10 stays LOW, the latch comprising gates 16 and 18 is not affected. This is so because the output of the gate 16 (the node point 23) remains LOW.

Due to the symmetry of the FIG. 1 circuit, an operation similar to that described above will occur if the input terminal 11 goes LOW while the input terminal 10 stays HIGH. But under those conditions, the output terminal 12 of the detector 24 will be LOW and the output terminal 13 will be HIGH. This output signal condition is just the reverse of the previously described condition that resulted from the input terminal 10 going LOW while the input terminal 11 remained HIGH.

Assume now that both of the input terminals 10 and 11 of the FIG. 1 circuit go LOW at the same time. This condition, which will be described with the aid of the waveforms shown in FIG. 3, is the one in which the arbiter circuit has to make an arbitrary decision as to which one of the input signals will be given priority. In other words, for that condition the FIG. 1 circuit performs an arbitration function.

Initially, as indicated at $T_0$ in FIG. 3, both of the signals applied to the input terminals 10 and 11 of FIG. 1 are HIGH. Also, at $T_0$, the node points 22 and 23 are LOW, the input terminals 20 and 21 of the detector 24 are both HIGH and, as a result, both of the output terminals 12 and 13 are HIGH.

As the input terminals 10 and 11 of FIG. 1 both go LOW at the same time ($T_1$ in FIG. 3), the following events can occur. At some time ($T_2$) after the terminals 10 and 11 went LOW, the node points 22 and 23 go HIGH. When the node points 22 and 23 go HIGH, the cross-coupled HIGH inputs to the gates 16 and 18 will cause the points 22 and 23 to go back to LOW again, thereby producing a so-called rut pulse at each of the points 22 and 23, as shown at $T_2$ in FIG. 3. The rut pulse that is produced at the input to each of the gates 16 and 18 may cause the points 22 and 23 to go, at $T_3$, to a third state which is metastable. This is an unstable state, and, after some period of time, one of the node points 22 and 23 will go LOW while the other will go HIGH, shown at $T_4$ in FIG. 3. The design of the gates 16, 18, 17 and 19 is such that, during the time in which the gates 16 and 18 are in the metastable state, the outputs of the gates 17 and 19 will be LOW.

During the above-described condition, the output terminals 12 and 13 of the FIG. 1 circuit remain HIGH so long as the voltages applied to the input terminals 20 and 21 of the detector 24 do not differ by more than the aforementioned specified value. However, after the latch comprising the gates 16 and 18 has left the metastable state and soon after the voltage difference between the terminals 20 and 21 exceeds the specified value, the detector 24 will provide LOw and HIGH signals on its respective output terminals. If the terminal 21 went HIGH, as indicated at $T_5$ in FIG. 3, the output terminal 13 will subsequently go LOW, at $T_6$ of FIG. 3, and the output terminal 12 remains HIGH. On the other hand, if the terminal 20 had gone HIGH, then the output terminal 12 would have gone LOW while the terminal 13 would have remained HIGH.

FIG. 4 is a complete schematic diagram of one specific illustrative embodiment of the arbiter circuit shown in FIG. 1. In FIG. 4, the particular circuitry included in the gates 14 through 19 and in the difference detector 24 is shown in dash-line boxes whose reference numerals correspond to those employed in FIG. 1. Input terminals 10 and 11 and output terminals 12 and 13 of the FIG. 1 circuit are also shown in FIG. 4. Additionally, the input terminals 20 and 21 of the difference detector 24 are shown. Further, FIG. 4 also includes a supply voltage terminal 26 designed to be connected to a positive source designated $+V_{cc}$.

By way of example, the FIG. 4 circuit comprises only ten conventional Schottky-diode-clamped bipolar transistors Q1 through Q10 of the open-collector type. All the transistors are of the npn type. Additionally, the depicted circuit also includes twelve resistors designated R1 through R12 and four diodes D1 throuqh D4. The diodes D1 through D4, which are included to establish input threshold voltages, can be either conventional diodes (as shown) or standard Schottky diodes.

In FIG. 4, the aforementioned specified value by which the voltages of the input terminals 20 and 21 of the difference detector 24 must differ to cause the output terminals 12 and 13 to change from their initial HIGH states is a value greater than the base-to-emitter drop of the depicted transistors. Herein, this voltage drop is designated $V_{be}$. In practice, $V_{be}$ is approximately +0.7 volts.

Furthermore, the collector-to-emitter drop of an ON transistor in the FIG. 4 circuit will be designated $V_{sat}$. Illustratively, $V_{sat}$ is about +0.3 volts which is at the lower end of a range of voltages representative of the LOW state specified herein. Also, the forward voltage drop across each of the Schottky-diode clamps included in the transistors Q1 and Q2 is designated Vsch. Herein, the value of Vsch is, for example, about +0.4 volts.

Further, the value of the positive source Vcc connected to the terminal 26 of FIG. 4 will be assumed to be +5 volts. This value is representative of the HIGH state specified herein.

Initially, when both of the input terminals 10 and 11 of FIG. 4 are HIGH, the outputs of inverter gates 14 and 15 are each at Vbe−Vsch=Vsat. This LOW condition holds transistors Q3, Q4, Q5 and Q6 OFF. With Q5 and Q6 OFF, the input terminals 20 and 21 of the difference detector 24 are each at Vcc. This holds Q7 and Q8 OFF and, as a result, each of the output terminals 12 and 13 is at Vcc which is representative of the HIGH state.

Assume now that the signal applied to the input terminal 10 of FIG. 4 goes LOW while the signal applied to the input terminal 11 remains HIGH. The output of Q1 will be HIGH and the output of Q2 will be LOW. Q3 and Q5 will each turn ON when the output of Q1 reaches approximately one Vbe. The output of Q2 will be held at one Vsat which is LOW. When Q5 turned ON, it caused the input terminal 20 of the detector 24 to drop to one Vsat. In turn, this causes Q8 to turn ON thereby allowing the output terminal 13 to pull down to two Vsat (the drop across Q5 and Q8) which is representative of the LOW state. Q7 remains OFF and thus the output terminal 12 remains at Vcc (HIGH).

Assume now that the signal applied to the input terminal 10 remains HIGH while the signal applied to the input terminal 11 goes LOW. In response thereto, the output of Q1 is LOW and the output of Q2 is HIGH. Q4 and Q6 will each be turned ON, and Q3 and Q5 will each be turned OFF. The collectors of Q4 and Q6 will each pull down to one Vsat. This holds the output of Q1 LOW and pulls the input terminal 21 of the detector 24 LOW. The input terminal 20 is HIGH because Q5 is OFF. When the terminal 21 pulls greater than one Vbe below the voltage at the terminal 20, Q7 turns ON and the output terminal 12 goes to two Vsat as Q6 and Q7 turn ON hard.

In the situation in which the signals applied to the input terminals 10 and 11 go LOW simultaneously, the outputs of Q1 and Q2 rise at the same time. This turns Q3, Q4, Q5 and Q6 ON. The collectors of Q3 and Q4 pull up to about one Vbe and enter a metastable state. Q3 and Q4 remain in that state until system noise causes one transistor to dominate and turn ON, which turns the other transistor OFF. While these transistors are in a metastable state, the collectors of Q5 and Q6 are each pulled to one Vsat due to the ratio of resistors R1, R2, R3 and R4 (which is specified below). With the input terminals 20 and 21 each LOW, Q7 and Q8 are OFF and each of the output terminals 12 and 13 is HIGH. This condition persists until the metastable state is resolved.

The connection of the cross-coupled transistors Q3 and Q4 of FIG. 4 is characterized by small-length loops and hence by rapid response time. As a result, the timing window in which metastability can occur is established at or near a minimum. Further, in order to insure the smallest metastability window, it is advantageous to match all components in the gate 14 with the corresponding components in the gate 15. Also, in practice, Q1 and Q2 should be turned OFF as rapidly as possible.

By way of example, the value of each of the resistors R3 and R4 shown in FIG. 4 should be about three times the value of R1 (or R2). Illustratively, R1=3K ohms, R2=3K ohms, R3=9K ohms, and R4=9K ohms. Also, for example, R5=R8=10K ohms, R6=R9=10K ohms, and R7=R10=4K ohms.

An advantageous characteristic of the FIG. 4 circuit is that the voltage levels appearing at the output terminals 12 and 13 are compatible with the levels utilized in the standard digital circuit technology known as TTL. In the FIG. 4 circuit, Vcc represents HIGH but, as described earlier above, the output LOW state is represented by a voltage that is even lower than the voltage that usually represents LOW in standard TTL. In FIG. 4, the LOW state equals only two Vsat. As a result, the FIG. 4 circuit exhibits excellent noise margins relative to a standard TTL circuit.

As noted earlier above, the circuit shown in FIG. 4 includes only ten transistors. In practice, the depicted circuit therefore consumes relatively little power. Additionally, due to its relatively short signal propagation paths, the circuit is capable of operating in a high-speed manner. Further, because the transistors are all of the npn type, the circuit can be easily made by a variety of integrated-circuit fabrication processes.

In accordance with a particular feature of the present invention, a modified version of the arbiter circuit shown in FIG. 1 is utilized to form a unique n-input arbiter circuit. The modified circuit is depicted in FIG. 5.

Figures 5, 6:
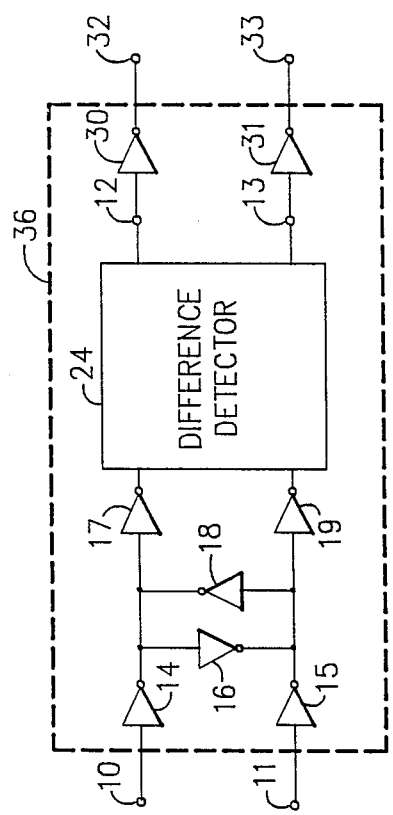
FIG. 5 represents a modified version of the FIG. 1 circuit.
FIG. 6 is the logical truth table for the FIG. 5 circuit.

The FIG. 5 circuit is identical to the FIG. 1 circuit except that FIG. 5 includes two additional inverter gates 30 and 31. Since the two circuits are otherwise the same, the reference numerals employed in FIG. 1 are also utilized in FIG. 5. Additionally, the FIG. 5 circuit includes output terminals 32 and 33. The signals appearing at the terminals 32 and 33 are respectively inverted versions of the signals that appear at the output terminals 12 and 13 shown in FIG. 1.

FIG. 6 is a truth table for the FIG. 5 circuit. Each 0 input representation in FIG. 6 indicates which of the input terminals 10 and 11 went LOW first. Further, the table indicates that if the input terminal 10 goes LOW first, the output terminal 32 will provide a 1 (or HIGH) signal and the output terminal 33 will provide a 0 (or LOW) signal. Similarly, if the input terminal 11 goes LOW first, the output terminal 32 will provide a 0 (or LOW) signal and the output terminal 33 will provide a 1 (or HIGH) signal. As indicated, if each of the input signals is a 1 (or HIGH), the output terminals 32 and 33 each provide a 0 (or LOW) signal.

The table of FIG. 6 does not include an entry representative of each of the input terminals 10 and 11 of FIG. 5 having a 0 (or LOW) signal applied thereto. This is so because, as described in detail earlier above, sooner or later one of two simultaneously applied LOW input signals will be arbitrarily selected by the FIG. 5 circuit to have occurred first.

The inverter gates 30 and 31 of FIG. 5 are identical to each other and may be implemented in various known ways. One specific illustrative embodiment of the gate 30 of FIG. 5 is shown in FIG. 7.

Figure 7:
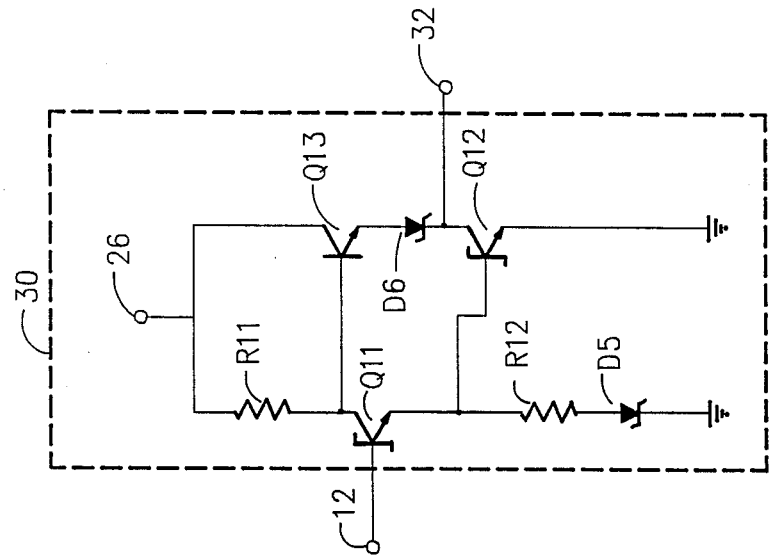
FIG. 7 shows a specific illustrative embodiment of one of the output inverter gates of FIG. 5.

By way of example, the gate 30 represented in FIG. 7 comprises a conventional arrangement including Schottky-diode-clamped bipolar transistors Q11 and Q12, bipolar transistor Q13, Schottky diodes D5 and D6 and resistors R11 and R12. Input terminal 12 and output terminal 32 of FIG. 7 respectively correspond to the identically numbered terminals in FIG. 5.

In accordance with the present invention, an n-input arbiter circuit comprises $(n-1)+(n-2)+\ldots$ +[n−(n−1)] identical two-input arbiter circuits, where n is a positive integer greater than 2. (The noted expression can be reduced to n(n−1)/2.) Advantageously, each such two-input circuit is of the type shown within dash-line box 36 in FIG. 5. But, other two-input arbiter circuits may also be employed. In any case, each two-input circuit is connected to arbitrate between the signals of a different pair of the (n−1)+(n−2)+...+[n−(n−1)] possible paired combinations of n inputs.

Herein, for purposes of a specific illustrative example, a 4-input arbiter circuit made in accordance with the invention is described next. Such a 4-input circuit comprises six identical two-input arbiter circuits of the type shown in FIG. 5 within box 36. For four inputs respectively designated S1, S2, S3 and S4, each two-input circuit is connected to arbitrate between the signals of a different pair of the six possible paired combinations of four inputs. These pairs are: S1-S2, S1-S3, S1-S4, S2-S3, S2-S4, and S3-S4.

Figure 8:
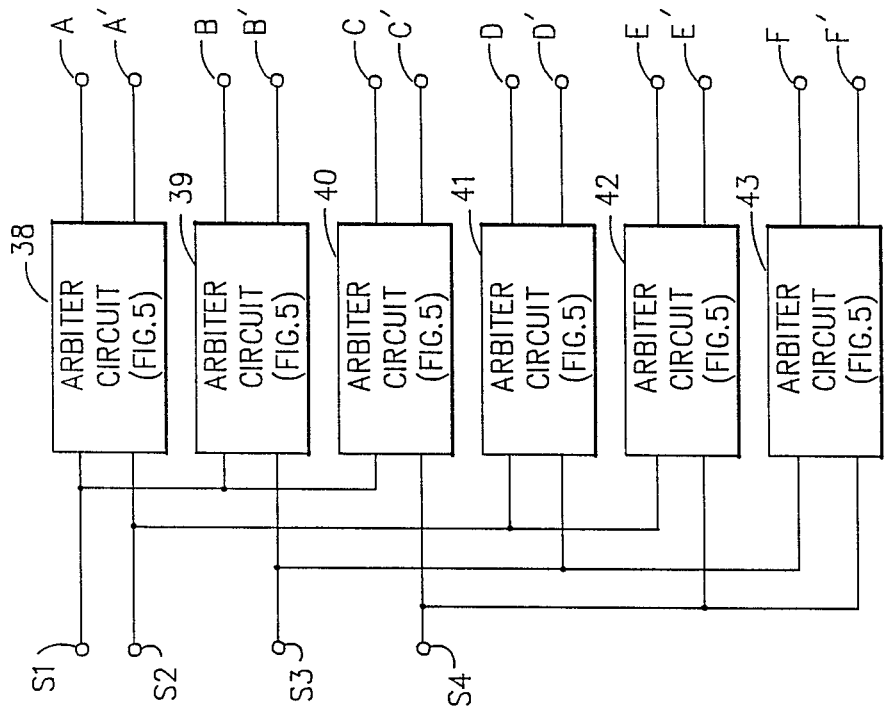
FIG. 8 depicts six of the FIG. 5 circuits connected to four input terminals.

FIG. 8 shows six of the FIG. 5 circuits interconnected to arbitrate between different pairs of the four input signals S1, S2, S3 and S4. Specifically, arbiter circuits 38 through 43 are shown connected to arbitrate, respectively, between S1-S2, S1-S3, S1-S4, S2-S3, S2-S4, and S3-S4.

In FIG. 8, the input signal that arrives first will win all of its individual arbitrations. Thus, if, for example, S2 arrives first, the outputs of the circuits 38, 41 and 42 will provide output representations indicative of S2/S1 (that is, that S2 was granted priority over S1), S2/S3 and S2/S4, respectively.

To establish a convenient basis for subsequent discussion, each of the output terminals of the arbiter circuits 38 through 43 of FIG. 8 is labeled with a letter. Thus, for example, the output terminals of the circuit 38 are respectively designated A and A'. These terminals correspond to the upper and lower output terminals 32 and 33, respectively, shown in FIG. 5.

If the input signal S1 arrives at the arbiter circuit 38 (FIG. 8) before S2, or if they arrive simultaneously and the circuit 38 gives priority to S1, output A will o provide a HIGH (or 1) signal and output A' will provide a LOW (or 0) signal. This is consistent with the truth table of FIG. 6.

Conversely, if the input signal S2 arrives at the arbiter circuit 38 before S1, or if they arrive simultaneously and the circuit 38 gives priority to S2, output A will provide a LOW (or 0) signal and output A' will provide a HIGH (or 1) signal. This condition also is indicated in the truth table of FIG. 6.

Thus, in the case assumed above wherein S2 is the first of the four signals to arrive at the inputs of the FIG. 8 circuit, the output terminals A', D and E will each go HIGH. All the other output terminals shown in FIG. 8 will remain LOW. As will be described in more detail later below in connection with the description of FIG. 9, logic circuitry connected to the output terminals of FIG. 8 responds to this set of conditions to provide a LOW signal only on the output terminal G2 of FIG. 9 that corresponds to input signal S2.

Two or more of the input signals S1, S2, S3 and S4 may arrive simultaneously at the inputs of the FIG. 8 circuit. Assume, for example, that all four inputs arrive simultaneously. Since each of the circuits 38 through 43 performs an independent arbitration that is unrelated to the arbitration decisions made by the other circuits, a possibility exists that the outputs of the circuits 38 through 43 could provide HIGH and LOW representations indicative of the following inconsistent individual arbitrations: S1/S2, S2/S3, S3/S4, S4/S1, S1/S3 and S4/S2.

In accordance with the principles of the present invention, the logic circuitry connected to the FIG. 8 circuit is designed such that the above-assumed set of individual arbitrations and all other statistically probable sets are in effect encoded to insure proper functionality of the herein-considered 4-input arbiter circuit. In other words, the logic circuitry is designed to embody an encoding pattern that activates one and only one at a time of the output terminals G1, G2, G3 and G4 of FIG. 9 regardless of the timing of the occurrence of input signals S1, S2, S3 and S4.

Figure 9:
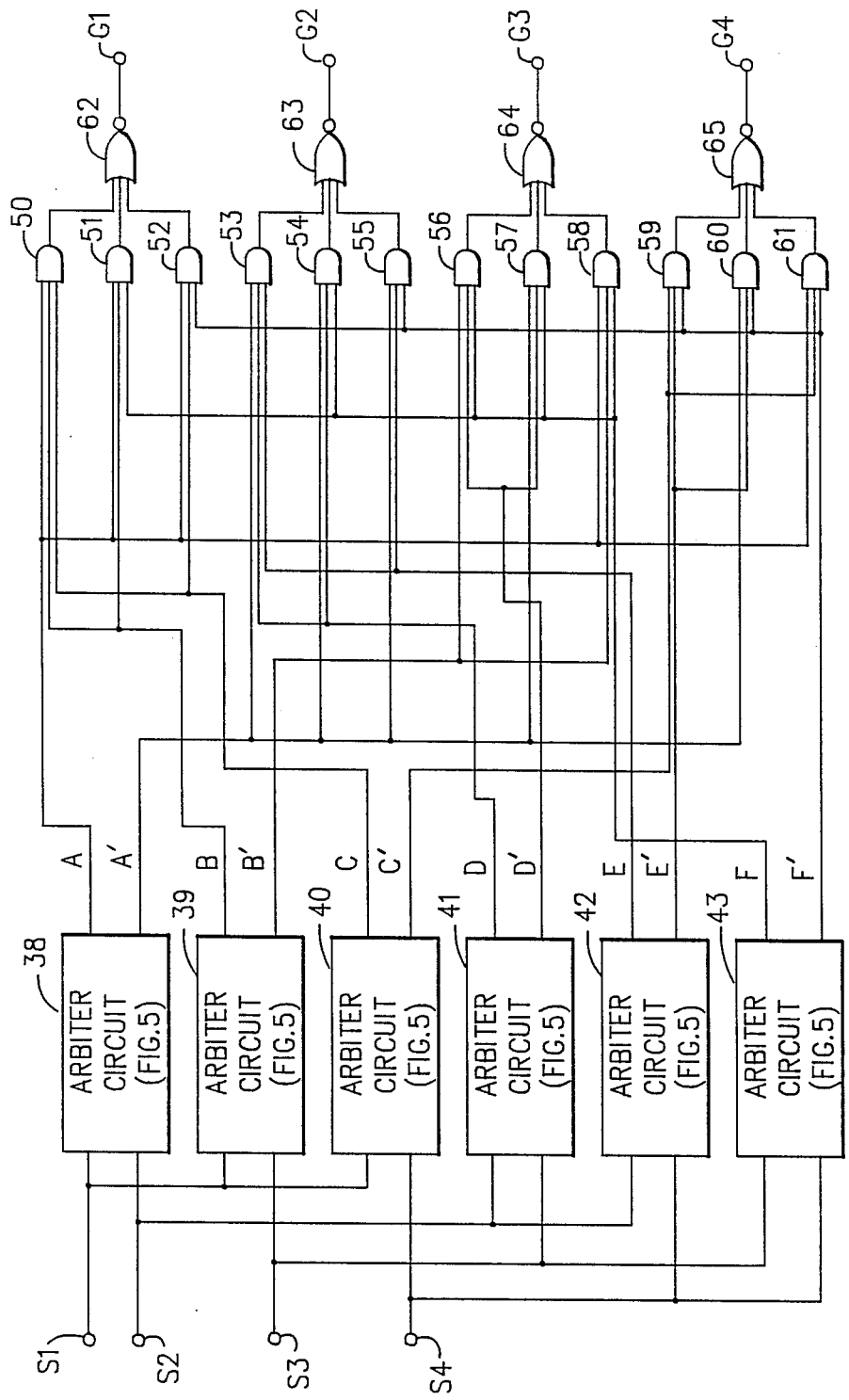
FIG. 9 shows logic circuitry connected to the FIG. 8 arrangement to form an illustrative four-input arbiter circuit made in accordance with the herein described inventive principles.

By Karnaugh mapping techniques, Boolean-type expressions were formulated that define the conditions under which output terminals G1, G2, G3 and G4 of FIG. 9 are activated in response to any pattern of occurrence of the input signals S1, S2, S3 and S4. By designing logic circuitry that embodies these expressions and connecting that circuitry to the FIG. 8 circuit, a systematic and unequivocal basis was provided for causing one and only one at a time of the output terminals G1, G2, G3 and G4 to be activated regardless of the relative timing of the input signals S1, S2, S3 and S4. Herein, for illustrative purposes, the single activated one of the output terminals G1, G2, G3 and G4 is assumed to be driven LOW while the other three terminals remain HIGH.

The aforementioned expressions that define the conditions under which output terminals G1, G2, G3 and G4 of FIG. 9 are activated are as follows: G1=ABC+ABF+ACF', G2+A'DE+A'DF+A'EF', G3=B'D'F+A'D'F+AB'F and G4=C'E'F'+A'E'F'+AC'F'.

The specific illustrative logic circuitry represented in FIG. 9 implements the above-specified expressions. The depicted logic circuitry comprises twelve AND gates 50 through 61 and four NOR gates 62 through 65 interconnected in the particular manner shown in FIG. 9.

The correspondence between the above-specified expressions and the logic circuitry of FIG. 9 can be illustrated by considering the example discussed earlier above in which input signal S2 was assumed to occur first. In that example, the output terminals A', D and E of the arbiter circuits 38, 41 and 42, respectively, each went HIGH and all the other output terminals of the circuits 38 through 43 remained LOW. As indicated in FIG. 9, the result of this condition is that only the AND gate 53 has three HIGH signals applied to its three respective inputs. Hence, only the AND gate 53 provides a HIGH output to its associated NOR gate. Accordingly, only the NOR gate 63 provides a LOW or activation signal at its output. As a result, only the output terminal G2 is activated or driven LOW. All the other output terminals G1, G3 and G4 remain HIGH.

The example specified in the paragraph immediately above is defined by the first term of the G2 expression. In other words, G2=A'DE represents that G2 is activated or driven LOW if A' and D and E are each HIGH.

Similarly, the first terms of the expressions for G1, G3 and G4 each define the conditions that exist in the FIG. 9 circuit if S1, S3 or S4 respectively appears first at the input of FIG. 9. If S1 appears first, only A, B and C go HIGH and only AND gate 50 will provide a HIGH signal, which causes output terminal G1 to go LOW. If S3 appears first, only B', D' and F will go HIGH and only AND gate 56 will provide a HIGH signal, which causes output terminal G3 to go LOW. If S4 appears first, only C', E' and F' will go HIGH and only AND gate 59 will provide a HIGH signal, which causes output terminal G4 to go LOW.

Furthermore the terms in the expressions for G1, G2, G3 and G4 prescribe specific output results for all possible cases in which two or more signals arrive simultaneously at the inputs to the FIG. 9 circuit. In that way, every possible input occurrence is assigned a particular output condition. In every possible case, priority is assigned to a particular one of simultaneously applied input signals.

An n-input arbiter circuit of the particular type shown in FIG. 9 and described herein is fully asynchronous and will not produce erroneous outputs. It also will not display a metastable state on its outputs. Such a circuit is useful in a number of applications of practical interest where a number of asynchronously occurring input request signals are competing for attention or service. A typical such application involves n users competing on a first-come, first-served basis for access to a bus cycle in an information processing system.

In the arbiter circuits described herein, the selected input signal must remain active (e.g. LOW) to maintain its priority. If the selected input becomes inactive (HIGH), any lower-priority active input will move up in priority.

Finally, it is to be understood that the above-described arrangements are only illustrative of the principles of the present invention. In accordance with these principles, numerous modifications and alternatives may be devised by those skilled in the art without departing from the spirit and scope of the invention.

What is claimed is:

1. A two-input arbiter circuit comprising
   first and second input terminals,
   a difference detector having first and second input terminals and first and second output terminals,
   means comprising series-connected first and second inverter gates connected between said first input terminal of said circuit and said first input terminal of said difference detector,
   means comprising series-connected third and fourth inverter gates connected between said second input terminal of said circuit and said second input terminal of said difference detector,
   and fifth and sixth inverter gates cross-coupled to form a latch, said latch being connected to a point between said first and second inverter gates and to a point between said third and fourth inverter gates.

2. A circuit as in claim 1 wherein said first and second inverter gates are connected in series to propagate signals from said first input terminal of said circuit to said first input terminal of said difference detector, and wherein said third and fourth inverter gates are connected in series to propagate signals from said second input terminal of said circuit to said second input terminal of said difference detector.

3. A circuit as in claim 2 wherein the output of said first inverter gate is connected to the inputs of said second and fifth inverter gates and to the output of said sixth inverter gate, and wherein the output of said third inverter gate is connected to the inputs of said fourth and sixth inverter gates and to the output of said fifth inverter gate.

4. A circuit as in claim 3 wherein said first through sixth inverter gates and said difference detector each comprise a Schottky-diode-clamped bipolar transistor of the open-collector type.

5. A circuit as in claim 4 wherein the collector of the transistor in said fifth inverter gate is directly connected to the base of the transistor in said sixth inverter gate and the collector of the transistor in said sixth inverter gate is directly connected to the base of the transistor in said fifth inverter gate.

6. A circuit as in claim 5 wherein said first and third inverter gates are substantially identical to each other.

7. A circuit as in claim 6 wherein each of said second and fourth inverter gates consists of a single transistor and a single resistor connected to the collector thereof.

8. A circuit as in claim 7 wherein said difference detector consists of only two transistors, the bases of said two transistors constituting the inputs of said detector and the collectors of said two transistors constituting the outputs of said detector, the base of one of said two transistors being directly connected to the emitter of the other one of said two transisters.

9. A circuit as in claim 8 wherein said difference detector is responsive only to voltages applied to its first and second input terminals that exceed approximately one Vbe.

10. A circuit as in claim 1 further comprising seventh and eighth inverter gates respectively connected to said first and second output terminals of said difference detector.

11. An n-input arbiter circuit comprising $(n-1)+(n-2)+\ldots[n-(n-1)]$ two-input arbiter circuits, where n is a positive integer greater than 2,
   means interconnecting the n inputs of said n-input arbiter circuit to the inputs of said two-input circuits such that each two-input circuit is connected to arbitrate between the inputs of one of the $(n-1)+(n-2)+\ldots+[n-(n-1)]$ different possible pairs of n inputs, said two-input arbiter circuits being responsive to one or more request signals applied to said n inputs at a given instant of time for making a decision in each individual two-input circuit of which of two request signals applied thereto is to be given priority on the two outputs of each individual two-input circuit,
   and logic circuitry connected to the outputs of said two-input circuits for supplying a priority signal to one and only one at a time of n outputs of said n-input circuit.

12. An n-input arbiter circuit as in claim 11 wherein each of said two-input arbiter circuits comprises
   first and second input terminals,
   a difference detector having first and second input terminals and first and second output terminals,
   means comprising series-connected first and second inverter gates connected between said first input terminal of said circuit and said first input terminal of said difference detector,
   means comprising series-connected third and fourth inverter gates connected between said second input terminal of said circuit and said second input terminal of said difference detector,
   fifth and sixth inverter gates cross-coupled to form a latch, said latch being connected to a point between said first and second inverter gates and to a point between said third and fourth inverter gates,
   and seventh and eighth inverter gates respectively connected to said first and second output terminals of said difference detector.

* * * * *